(12) United States Patent
Reinhardt et al.

(10) Patent No.: US 9,059,677 B2
(45) Date of Patent: Jun. 16, 2015

(54) ACOUSTIC WAVE ELECTROMECHANICAL DEVICE COMPRISING A TRANSDUCTION REGION AND AN EXTENDED CAVITY

(75) Inventors: Alexandre Reinhardt, Saint Martin d'Heres (FR); Emmanuel Defay, Voreppe (FR); Francois Perruchot, Grenoble (FR)

(73) Assignee: Commissariat A L'Energie Atomique ET Aux Energies Alternatives, Paris (FR)

( * ) Notice: Subject to any disclaimer, the term of this patent is extended or adjusted under 35 U.S.C. 154(b) by 13 days.

(21) Appl. No.: 13/456,026

(22) Filed: Apr. 25, 2012

(65) Prior Publication Data

US 2013/0106243 A1   May 2, 2013

(30) Foreign Application Priority Data

Apr. 28, 2011   (FR) .................................... 11 53633

(51) Int. Cl.
*H03H 9/25* (2006.01)
*H03H 3/02* (2006.01)
(Continued)

(52) U.S. Cl.
CPC . *H03H 9/25* (2013.01); *H03H 3/02* (2013.01); *H03H 3/08* (2013.01); *H03H 9/02228* (2013.01); *H03H 9/02622* (2013.01); *H03H 9/02669* (2013.01); *H03H 9/0542* (2013.01); *H03H 9/17* (2013.01); *H03H 9/542* (2013.01); *H03H 9/6403* (2013.01)

(58) Field of Classification Search
USPC .......................................... 310/313 R, 313 B
See application file for complete search history.

(56) References Cited

U.S. PATENT DOCUMENTS 3,760,204 A * 9/1973 Yester, Jr. .................. 310/313 B
4,166,258 A * 8/1979 Tseng ............................ 333/195
(Continued)

FOREIGN PATENT DOCUMENTS

FR       2905208 A1   2/2008
GB       1260525 A    1/1972

OTHER PUBLICATIONS

Jan H. Kuypers, et al., "Intrinsic Temperature Compensation of Aluminum Nitride Lamb Wave Resonators for Multiple-Frequency References", Proceedings of the 2008 IEEE Frequency Control Symposium, 2008, pp. 240-249, IEEE.
(Continued)

*Primary Examiner* — J. San Martin
(74) *Attorney, Agent, or Firm* — Baker & Hostetler LLP

(57) ABSTRACT

An electromechanical device having a resonator using acoustic waves propagating laterally within a piezoelectric plane resonant structure and electrodes on a face of said structure. The resonant structure comprises: a transduction region having a transduction length and generating acoustic waves; a free propagation region for the acoustic waves, adjacent to the transduction region and defined the plane of the transduction region; the resonant structure length being equal to an integer number of half-wavelengths, the resonance frequency of said resonator equaling the average propagation velocity of the wave within the structure divided by said wavelength, to adjust the quality factor of the resonator fixed by the length of the resonant structure and the coupling coefficient fixed by the ratio of the transduction length over the length of the resonant structure; the resonant structure defined by the assembly of the transduction region and the propagation region being laterally bounded by reflection regions.

14 Claims, 20 Drawing Sheets

(51) Int. Cl.
*H03H 3/08* (2006.01)
*H03H 9/02* (2006.01)
*H03H 9/05* (2006.01)
*H03H 9/17* (2006.01)
*H03H 9/54* (2006.01)
*H03H 9/64* (2006.01)

(56) References Cited

U.S. PATENT DOCUMENTS

| | | | |
|---|---|---|---|
| 4,467,235 A * | 8/1984 | De Wames et al. | 310/313 D |
| 4,486,724 A * | 12/1984 | Schofield | 333/194 |
| 5,287,036 A * | 2/1994 | Penunuri | 310/313 R |
| 7,126,110 B2 | 10/2006 | Papuchon et al. | |
| 7,569,971 B2 * | 8/2009 | Andle et al. | 310/313 D |
| 8,004,154 B2 | 8/2011 | Cueff et al. | |
| 2008/0048804 A1 | 2/2008 | Volatier et al. | |
| 2009/0102316 A1 | 4/2009 | Belot et al. | |
| 2010/0123367 A1 | 5/2010 | Tai et al. | |
| 2010/0181868 A1 | 7/2010 | Gaidarzhy et al. | |
| 2010/0182426 A1 | 7/2010 | Perruchot et al. | |
| 2010/0327995 A1 | 12/2010 | Reinhardt et al. | |
| 2011/0061215 A1 | 3/2011 | Defay et al. | |
| 2011/0273243 A1 | 11/2011 | Domingue et al. | |
| 2012/0007666 A1 | 1/2012 | David et al. | |
| 2012/0056299 A1 | 3/2012 | Defay et al. | |
| 2012/0145667 A1 | 6/2012 | Imbert et al. | |

OTHER PUBLICATIONS

K.M. Lakin, et al., "Thin Film Resonator Technology", Proceedings of the 1987 IEEE International Frequency Control Symposium, 1987, pp. 371-381, IEEE.

Zuoging Wang, et al., "Characterization of Electromechanical Coupling Coefficients of Piezoelectric Films Using Composite Resonators", IEEE Transactions on Ultrasonics, Ferroelectrics and Frequency Control, Sep. 2009, pp. 1327-1330, vol. 46, No. 5, IEEE.

J. Masson, et al, "Fabrication of High Stability Oscillators Using AlN/Si High Overtone Bulk Acoustic Resonators", Proceedings of the 2007 IEEE Ultrasonics Symposium, 2007, pp. 628-631, IEEE.

Kuangwoo Nam, et al, "Monolithic 1-Chip FBAR Duplexer for W-CDMA Handsets", Sensors and Actuators A, 2008, pp. 162-168, vol. 143, Elsevier.

Alexandre Reinhardt, et al., "Scattering Matrix Method for Modeling Acoustic Waves in Piezoelectric, Fluid, and Metallic Multilayers", Journal of Applied Physics, Nov. 15 2003, pp. 6923-6931, vol. 94, No. 10, American Institute of Physics.

Arthur Ballato, et al, "Modeling Piezoelectric and Piezomagnetic Devices and Structures via Equivalent Networks", IEEE Transactions on Ultrasonics, Ferroelectrics and Frequency Control, Sep. 2001, pp. 1189-1240, vol. 48, No. 5, IEEE.

Amanda A. Frederick, et al, "Frequency Tuning of Film Bulk Acoustic Resonators", Proc. of SPIE, 2006, 8 pages., vol. 6172.

I. Kone, et al., "Guided Acoustic Wave Resonators Using an Acoustic Bragg Mirror", Applied Physics Letters, 2010, pp. 223504-1-223504-3, vol. 96, American Institute of Physics.

* cited by examiner

ACOUSTIC WAVE ELECTROMECHANICAL DEVICE COMPRISING A TRANSDUCTION REGION AND AN EXTENDED CAVITY

CROSS-REFERENCE TO RELATED APPLICATION

This application claims priority to foreign French patent application No. FR 1153633, filed on Apr. 28, 2011, the disclosure of which is incorporated by reference in its entirety.

FIELD OF THE INVENTION

The field of the invention is that of electromechanical devices exploiting the propagation of acoustic waves with a view to implementing electrical resonator functions, these resonators in turn being used to implement more complex functions such as filters, frequency references or others. These devices have operating frequencies that can go from a few hundreds of kHz to a few GHz.

BACKGROUND

Resonators exploiting acoustic wave propagation may currently be subdivided into three main families:

surface wave resonators, which exploit the propagation of waves localized near to the surface of a piezoelectric substrate. The transduction between the electrical signal and the acoustic waves is effected by means of electrodes in the form of interdigitated combs deposited on the surface of the substrate. Resonators are usually formed by placing a transducer with interdigitated combs T between two reflector arrays R1 and R2, obtained by applying the same potential to periodic metallizations. FIG. 1 shows a diagram of such a resonator;

Lamb wave resonators or, more generally, resonators using waves guided within a piezoelectric layer. In this type of component, the waves propagate within a wafer, or within a part of a multilayer. The transduction is here again provided by a set of electrodes in the form of interdigitated combs $E_{Si}$ as illustrated in FIG. 2a, the difference with respect to surface waves is that it is also possible to place one or more electrodes on the lower face of the wafer or of the piezoelectric layer, where these can be continuous $E_I$ or equally in the form of interdigitated combs $E_{Ii}$, as illustrated in FIGS. 2b and 2c. These configurations are notably described in the article by J. H. Kuypers, C-M Lin, G. Vigevani and A. Pisano, *Intrinsic temperature compensation of Aluminum Nitride Lamb wave resonators for multiple-frequency references*, Proceedings of the 2008 IEEE Frequency Control Symposium.

In order to define a resonant cavity, two configurations are commonly employed and consist in using reflector arrays composed of short-circuited interdigitated combs (like for surface wave resonators), or in bounding the wafer (or the layer acting as a waveguide) so as to cause a reflection of the waves at the edge of the wafer (or of the layer);

bulk wave resonators, which exploit waves propagating vertically within a multilayer. The transduction is provided by electrodes between which a piezoelectric layer is sandwiched in the most general case. In some alternative configurations, the two electrodes are sometimes disposed side by side on the surface of the piezoelectric layer in order to be able to be excited by a horizontal, rather than vertical, electric field.

These resonators may be subdivided into two configurations: the first is called Film Bulk Acoustic Resonator (FBAR) in which the resonator is composed solely of the piezoelectric layer. This is then acoustically isolated by the use of a Bragg mirror MR composed of alternating layers on the surface of a substrate S, as shown in the example in FIG. 3, or by the formation of a cavity of air under the piezoelectric layer $C_{piezo}$ and the control electrode $E_S$, as illustrated in FIG. 4.

The second configuration relies on the substrate in order to take advantage of the acoustic properties of the latter. Generally speaking, this resonator is used in a harmonic resonance mode, which gives rise to its name High-overtone Bulk Acoustic Resonator (H BAR) when the substrate is thick. When the substrate is thinner, and a relatively low-order harmonic (of the order of a few units) is used, this is usually referred to as a Composite Resonator.

HBAR resonators have the advantage of allowing extremely high quality factors to be obtained at frequencies in the GHz range, as described in the article by K. M. Lakin, G. R. Kline, R. S. Ketcham, A. R. Landin, W. A. Burkland, K. T. McCarron, S. D. Braymen and S. G. Burns, *Thin film resonators technology*, Proceedings of the 1987 IEEE International Frequency Control Symposium, p. 371, notably when the resonator operates on a high harmonic. By a judicious choice of the ratio of thicknesses between the resonant cavity (the substrate) and the piezoelectric layer, the electromechanical coupling coefficient of a composite resonator may be adjusted as described in the article by Z. Wang, Y. Zhang and J. D. N. Cheeke, *Characterization of electromechanical coupling coefficients of piezoelectric films using composite resonators*, IEEE Transactions on Ultrasonics, Ferroelectrics and Frequency Control Vol. 46, N°5, p. 1327, September 2009.

A degree of freedom for adjusting both the quality factor of the resonator and its electromechanical coupling coefficient is thus available, even if, as a general rule, increasing one amounts to decreasing the other.

These two quantities are particularly interesting for the use of resonators in radiofrequency systems where they can be used as frequency-variable impedance elements in bandpass filters, or as frequency stabilization elements in oscillators. In the first case, the electromechanical coupling coefficient defines the bandwidth attainable by a filter (the relative bandwidth is around half of the electromechanical coupling coefficient of the resonators composing it), whereas the quality factor has a direct influence on the losses of this same filter and on its selectivity. Since these two criteria are mutually exclusive, a designer tries in general to favour one to the detriment of the other. This is not however easily done using resonators of the FBAR, SAW or guided wave resonator types. This is the reason for the interest in composite resonators.

The latter however have a major defect, which in practice hinders their use: since the resonator is made to operate on one harmonic mode, the spectrum of these components has all the resonances of the unused modes, as illustrated in FIG. 5. The freedom of design previously described is not therefore used in practice for filtering applications where the resonances of the unused harmonics interfere with the operation of the filter. These components are accordingly just used for oscillator applications which are less sensitive to the unwanted resonances and where a high quality factor is imperative, as described in the article by J. Masson, G. Martin, R. Boudot, Y. Gruson, S. Ballandras, A. Artieda, P. Muralt, B. Belgacem, L. Chommeloux, *Fabrication of high stability oscillators using AlN/Si high overtone bulk acoustic resonators*, Proceedings of the 2007 IEEE Ultrasonics Symposium, p. 628.

On the other hand, and this is a characteristic inherent to bulk wave components, the properties of an HBAR resonator are fixed by the thicknesses of the layers composing it. It is therefore very difficult to simultaneously produce components having different properties, because that would require the local addition or removal of layers allowing the frequency differentiation. This option is, in practice, used to form two, or even four, different types of resonators on the same structure, as described in the article by Nam et al., *Monolithic 1-chip FBAR duplexer for W-CDMA handsets*, Sensors and Actuators A, Vol. 143, p. 162 (2008), but seldom more than this, which limits the freedom in the design of systems.

SUMMARY OF THE INVENTION

In this context, the principle of the present invention consists in exploiting, in an electromechanical device, surface waves or waves propagating laterally within a piezoelectric layer (Lamb waves or guided waves), in a structure composed of a transduction region, notably possessing surface electrodes, and a free propagation region completing the resonant cavity of the assembly. Since the characteristics of the resonator are largely fixed by the lateral dimensions of the component, it becomes possible to simultaneously produce resonators having different frequency characteristics, offering more design possibilities than the conventional components presented in the aforementioned prior art.

More precisely, the subject of the present invention is an electromechanical device comprising at least one resonator using acoustic waves propagating laterally within a piezoelectric plane resonant structure and at least comprising electrodes on one of the faces of the said structure characterized in that the resonant structure comprises:

a transduction region having a transduction length and generating acoustic waves;

at least one free propagation region for the acoustic waves, adjacent to the said transduction region and defined in the same plane as the said transduction region;

the total length of the resonant structure being equal to an integer number of half-wavelengths ($n\lambda/2$), the said wavelength complying with the following equation $f=V/\lambda$, with f corresponding to the resonance frequency of the said resonator and V the average velocity of propagation of the wave within the structure, so as to adjust the quality factor of the resonator fixed by the total length of the resonant structure and the coupling coefficient fixed by the ratio of the transduction length over the total length of the resonant structure;

the resonant structure defined by the assembly of the transduction region and of the propagation region being laterally bounded by reflection regions.

According to one variant of the invention, the transduction region having a working frequency band referred to as transduction frequency band, the reflection regions having a working frequency band referred to as reflection frequency band, the resonance frequency of the resonator is included within the transduction and reflection working frequency bands.

According to one variant of the invention, the resonant structure comprises edges corresponding to a physical bounding corresponding to an interface between the propagation medium corresponding to a first medium and a second medium.

According to one variant of the invention, the piezoelectric plane structure furthermore comprises at least one region referred to as a tunability region formed by all or part of the propagation region and tunability electrodes formed on at least one of the faces of the tunability region so as to define at least one capacitor C capable of being connected to at least one external variable impedance.

According to one variant of the invention, each external variable impedance is obtained by a bank of fixed capacitors.

According to one variant of the invention, all or part of the electrodes of the structure form an interdigitated structure, or interdigitated structures, of surface electrodes on a first face of the said structure.

According to one variant of the invention, the tunability region only comprises electrodes on one of the faces of the structure in the said region.

According to one variant of the invention, the structure furthermore comprises at least one electrode on the second face of the said structure.

According to one variant of the invention, the device comprises a set of K tunability regions, the transduction region being included between, on the one side, M tunability regions and, on the other, N tunability regions, with K=M+N.

According to one variant of the invention, the tunability regions have variable lengths.

According to one variant of the invention, the said lengths follow a geometrical progression of the $L_n=L_0 a^n$ type, where $L_0$ is the length of the shortest tunability region, a is a factor of the progression and n is the index of the region.

According to one variant of the invention, the transduction region and at least one tunability region comprise a common electrode.

According to one variant of the invention, the piezoelectric plane structure furthermore comprises reflection regions comprising arrays of electrodes on the periphery of the free propagation and transduction regions.

According to one variant of the invention, the piezoelectric structure is made of AlN.

According to one variant of the invention, the piezoelectric structure is made of $LiNbO_3$.

BRIEF DESCRIPTION OF THE DRAWINGS

The invention will be better understood and other advantages will become apparent upon reading the description that follows presented by way of non-limiting example and with regard to the appended figures, amongst which.

DETAILED DESCRIPTION

Figure 1:
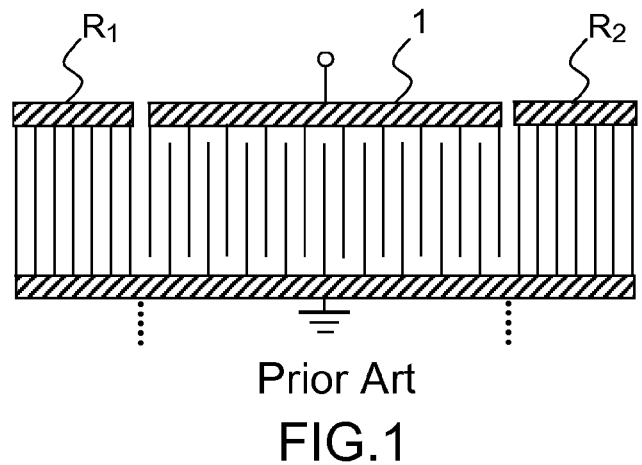
FIG. 1 illustrates one example of surface acoustic wave resonator according to the prior art.
Figure 2A:
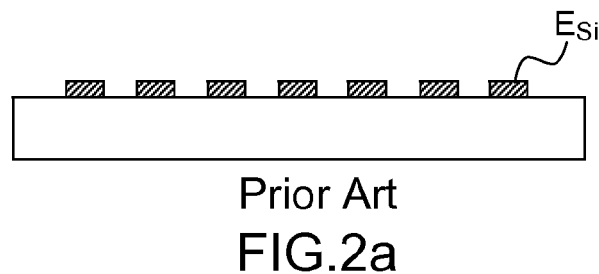
FIGS. 2a, 2b and 2c illustrate examples of Lamb wave resonators according to the prior art.
Figure 2B:
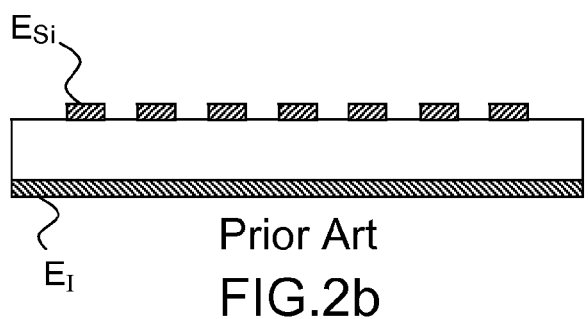
Figure 2C:
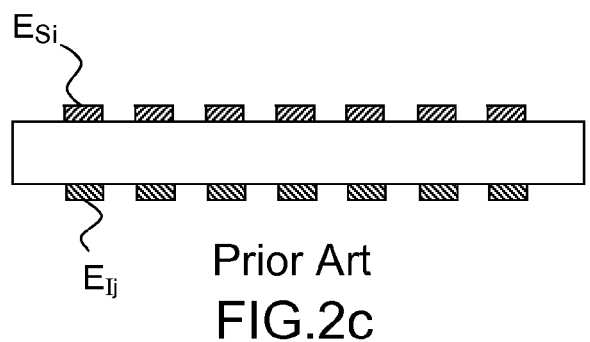
Figure 3:
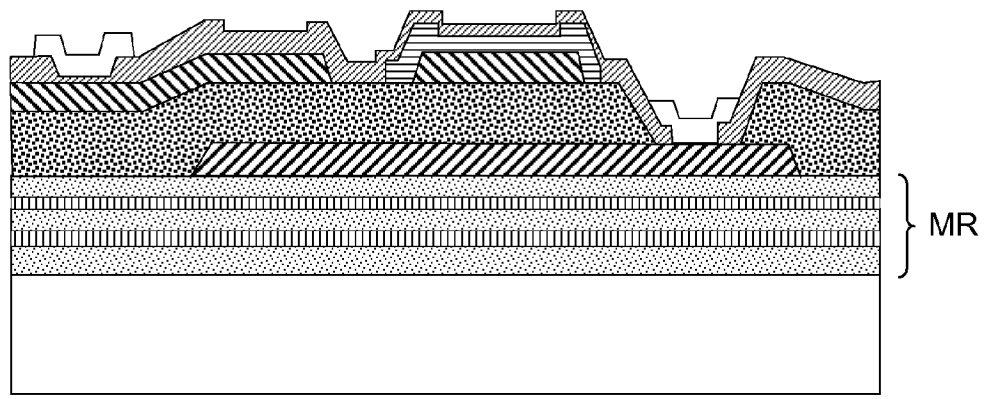
FIG. 3 illustrates one example of bulk wave resonator in a conventional configuration using a Bragg mirror structure.
Figure 4:
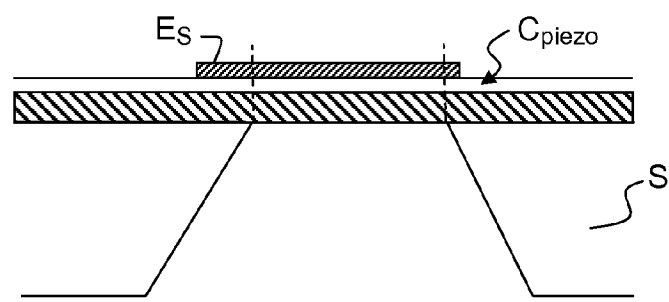
FIG. 4 illustrates one example of bulk wave resonator formed from a suspended piezoelectric layer according to the prior art.
Figure 5:
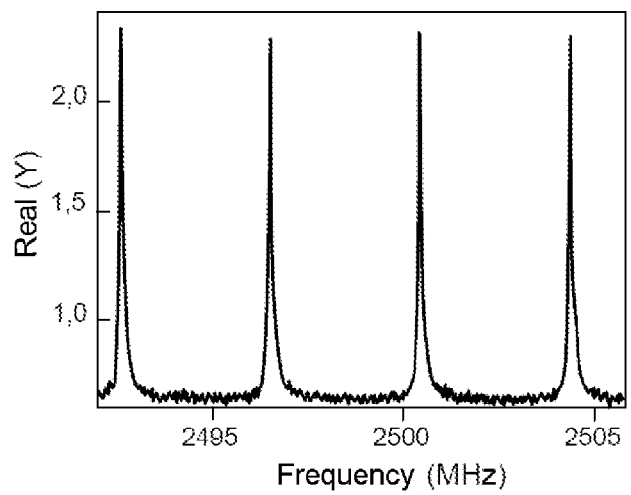
FIG. 5 illustrates one example of frequency spectrum of an HBAR resonator.
Figure 6:
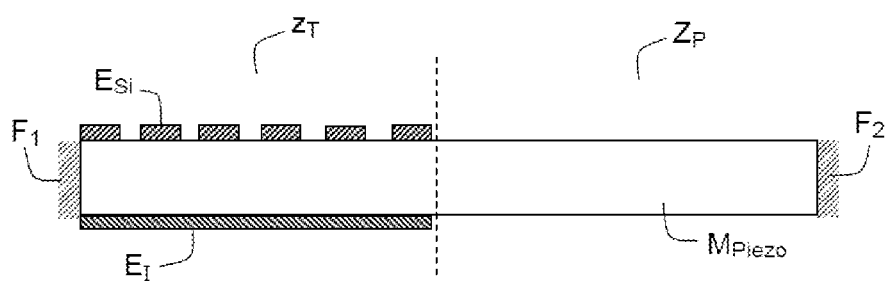
FIG. 6 illustrates a first example of electromechanical device of the invention using Lamb waves.

Generally speaking, the electromechanical device of the present invention comprises, as shown schematically in FIG. 6, a plane structure made of piezoelectric material $M_{piezo}$, comprising a transduction region $Z_T$ and at least one free propagation region $Z_P$ for the acoustic waves generated in the transduction region, in this diagram. The edges of the resonant cavity $F_1$ or $F_2$ can correspond to a physical bounding of the piezoelectric structure, an interface propagation medium/second medium which can typically be the ambient medium external to the said propagation piezoelectric material and providing a perfect reflection of the acoustic waves at all frequencies. It is equally possible to use an array of reflectors with short-circuited interdigitated combs, as commonly used for SAW resonators.

According to this example, the electromechanical device comprises a resonator using Lamb waves generated in a transduction region comprising interdigitated combs of electrodes $E_{Si}$ and a lower electrode $E_I$ on either side of the piezoelectric structure.

In such a structure, the resonant cavity allows several resonances to be generated. By increasing the order of the resonances, the value of the quality factor is increased at the same time because the resonance condition (the phase-shift of a wave over a return path through the cavity must be equal to 2 nΠ, with n the integer representing the order of the resonance) becomes more restrictive on the frequency as n increases (all other things remaining equal).

At the same time, the filtering properties of the transducer with interdigitated combs are used. This is because the transducer only operates efficiently when the synchronism condition (the period of the combs corresponds to a half-wavelength) is approximately fulfilled. Furthermore, for transducers having a large number of fingers, the periodic alternation of metallized and non-metallized regions produces a Bragg mirror effect which prevents (or at least attenuates) the propagation of the waves within a frequency range near to the resonance. The transducer therefore naturally acts as a frequency selective filter which then selects one (or several if required) modes of the resonant cavity. This effect is also purposely exploited in the case where reflectors based on short-circuited interdigitated combs are used to bound the resonant cavity. These reflectors are in this case effective for waves operating within a given frequency range and they reinforce the spectral filtering effect.

It should be noted that the transduction region can just as easily not be situated at the edge of a resonant cavity and be localized for example in the middle of the latter to obtain a similar effect.

Such a configuration allows a degree of freedom to be obtained allowing, on the one hand, the quality factor of the resonator (fixed by the length of the cavity) and, on the other, the electromechanical coupling coefficient (fixed by the ratio between the length of the transducer and the length of the resonant cavity) to be adjusted with respect to the configurations of the prior art.

First Example of Electromechanical Device According to the Invention

The electromechanical device comprises a plane structure of the aluminum nitride wafer type with a thickness of 2 μm metallized by 200 nm of molybdenum on its lower face.

It is first of all considered that the metallizations on the top face have a negligible thickness. Computer calculations, for example of the Green's function by the method described in the article by A. Reinhardt, T. Pastureaud, S. Ballandras and V. Laude, *Scattering matrix method for modeling acoustic waves in piezoelectric, fluid and metallic multilayers*, Journal of Applied Physics, Vol. 94, N°10, p. 6923, November 2003, allow the velocities of the first symmetrical Lamb mode to be determined when the surface is free or metallized.

Figure 7:
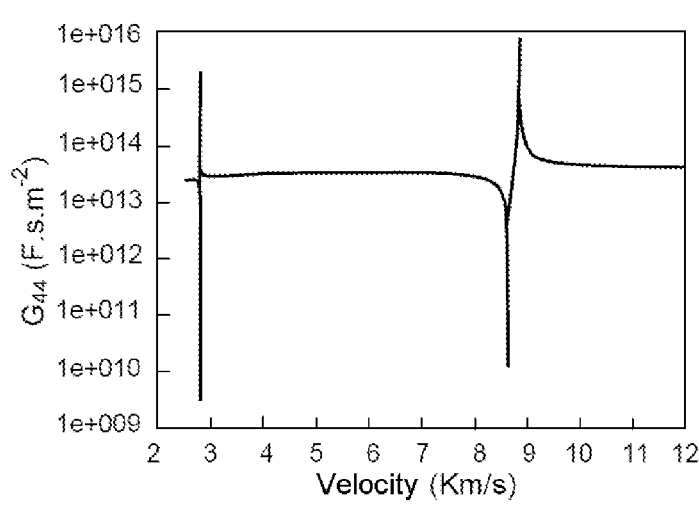
FIG. 7 illustrates one example of electrostatic Green's function for an AlN/Mo multilayer for a frequency of 285 MHz.

The Applicant was notably interested in the electrostatic Green's function (denoted $G_{44}$) which is a function allowing the electric potential to be linked to the surface charge density present on the surface of a piezoelectric layer, as a function of the velocity of propagation of the wave in question and of the frequency. Thus, the Green's function illustrated in FIG. 7 demonstrates phase velocities of 8622 m/s for the wave propagating under the metallized surface (where the piezoelectric layer is connected as a short-circuit, which corresponds to a minimum of the Green's function) and phase velocities of 8845 m/s when the surface is free (where the piezoelectric layer is left electrically floating, which corresponds to the maximum of the Green's function).

Using these parameters, a one-dimensional model of the resonator is constructed. This can be done using the COM model (Coupling Of Modes model), the mixed matrix method, or else by constructing a Mason model adapted as described in the article by A. Ballato, *Modeling piezoelectric and piezomagnetic devices and structures via equivalent net-*

*works*, IEEE Transactions on Ultrasonics, Ferroelectrics and Frequency Control, Vol 48, N°5, p. 1189, September 2001.

Figure 8:
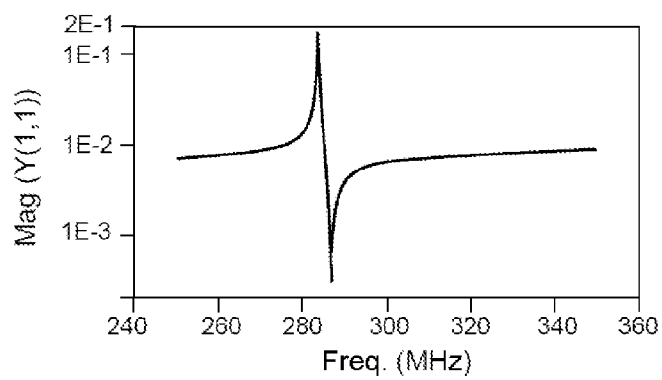
FIG. 8 illustrates one example of the electrical response of an infinite Lamb wave transducer.

As an initial step, the Applicant dimensioned an infinite transducer resonating at the frequency of 285 MHz. This is obtained for a comb period of p=15.1 μm (being a half-wavelength at 285 MHz, if an average velocity between the two velocities used is considered). It is considered that the width of the combs is a=p/2=7.55 μm. The electrical response of the infinite Lamb wave transducer is illustrated in FIG. 8.

In parallel, the Applicant dimensioned a device according to the invention comprising a transduction region adjacent to a free propagation region corresponding to a cavity composed of a section of membrane formed with an integer number of wavelengths (in other words, a length l=31 μm or 62 μm, or 93 μm, etc.).

Figure 9:
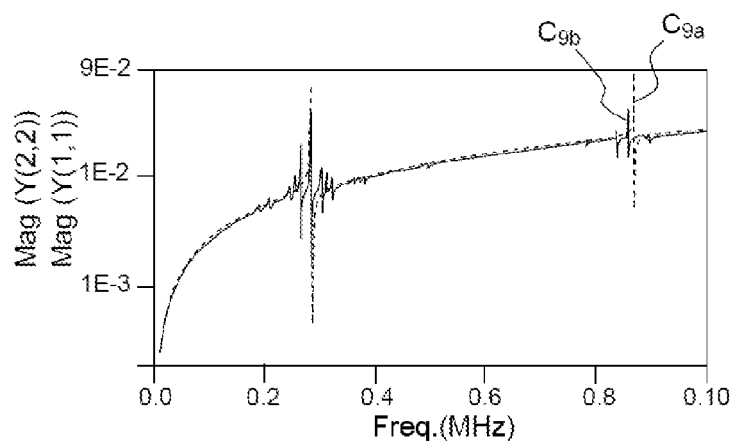
FIG. 9 illustrates the wideband electrical response of an infinite transducer and that of a device of the invention comprising a transduction region adjacent to a free propagation region.

The electrical response of a device according to the invention comprising a transducer with 5 fingers (i.e. 2.5 wavelengths) adjacent to a free propagation region with lateral dimensions equal to 5 wavelengths is shown in FIG. 9. The wideband electrical response of an infinite transducer is illustrated by means of the curve $C_{9a}$. The multiple resonances visible on the curve $C_{9b}$ are, in part, due to the formation of resonances caused by the acoustic discontinuities between the metallized and non-metallized regions and to the various resonances that may be generated within the structure, and, in part, due to the total length of the resonator.

Figure 10:
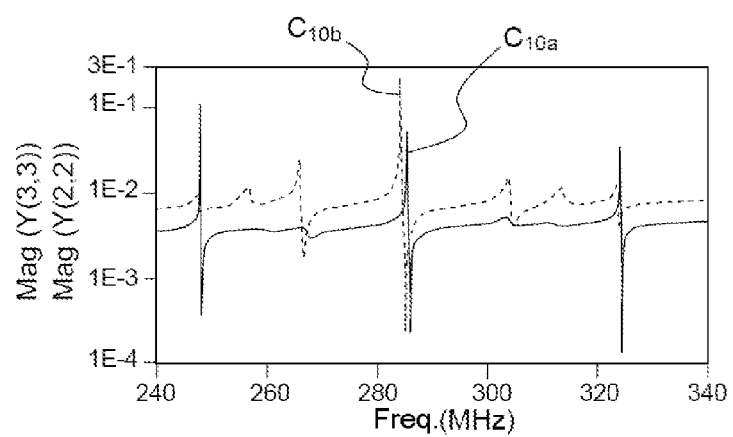
FIG. 10 illustrates the electrical response of a device according to the invention comprising a resonator with 3 and with 5 fingers.
Figure 11:
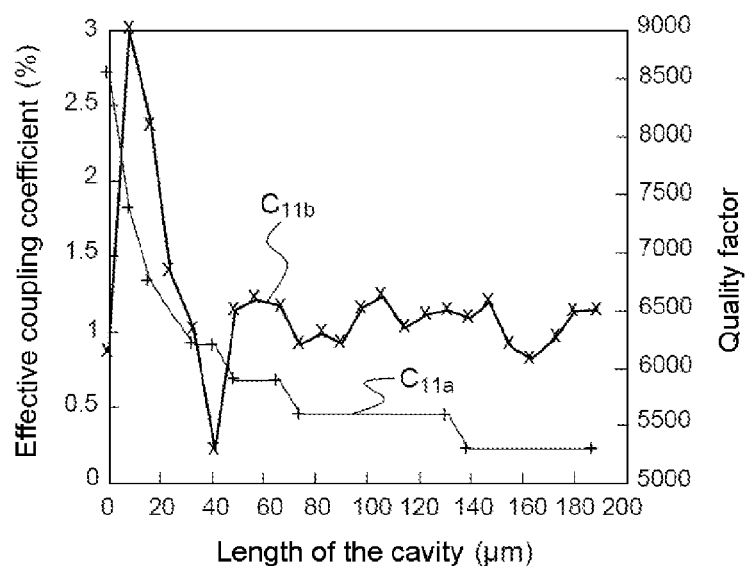
FIG. 11 illustrates the influence of the length of the free propagation region in an electromechanical device of the invention.

By way of example, FIG. 10 shows the influence of the number of fingers on the electrical response for two resonators having the same total length (equal to 7.5 wavelengths), only the ratio between the length of the cavity and the length of the transducer having changed. The curve $C_{10a}$ relates to a transducer comprising 3 fingers, the curve $C_{10b}$ relating to a transducer with 5 fingers. In particular, a decrease of the resonances close to the main resonance for 3 fingers can be seen, due to the fact that fewer internal reflections contribute to the establishment of these resonances, owing to a reduced number of fingers in the transducer. In contrast, the resonances further away (at 250 and 325 MHz), which correspond to harmonics established within the cavity, are reinforced since the effect of filtering by the periodicity of the combs of the transducer is reduced. It can also be noted that the greater the part of the resonator represented by the transducer (hence for 5 fingers), the higher the electromechanical coupling coefficient, which results in an increase in the frequency spacing between maximum (resonance frequency) and minimum (frequency of anti-resonance) of the modulus of the admittance, as for bulk-wave composite resonators. This is especially visible on the curves $C_{11a}$ and $C_{11b}$ in FIG. 11 which respectively show, for the case of a transducer with 5 fingers and a period of 4 μm, the influence of the length of the cavity on the effective coupling coefficient and on the quality factor.

The Applicant has indeed also studied the variation behaviour of the quality factor, determined from arbitrary propagation losses. For a cavity of only a few wavelengths, a high quality factor is noted due to the presence of a non-metallized region in the resonator, and where the propagation losses of the acoustic wave are lower. The quality factor then stabilizes at a limiting value which appears to be a compromise between propagation losses of the wave and increase in the quality factor by use of a structure operating at a high order of resonance.

Figure 12A:
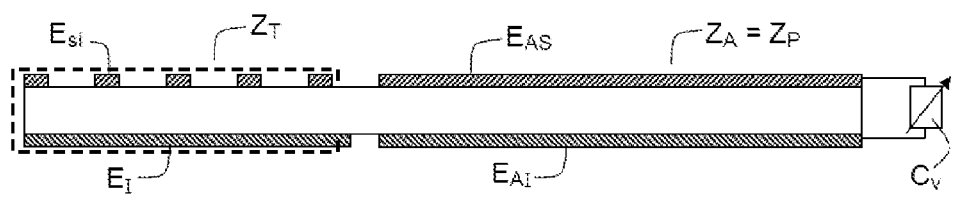
FIGS. 12a and 12b illustrate a cross-sectional view and a top view of an electromechanical device using Lamb waves according to the invention, which is tunable.
Figure 12B:
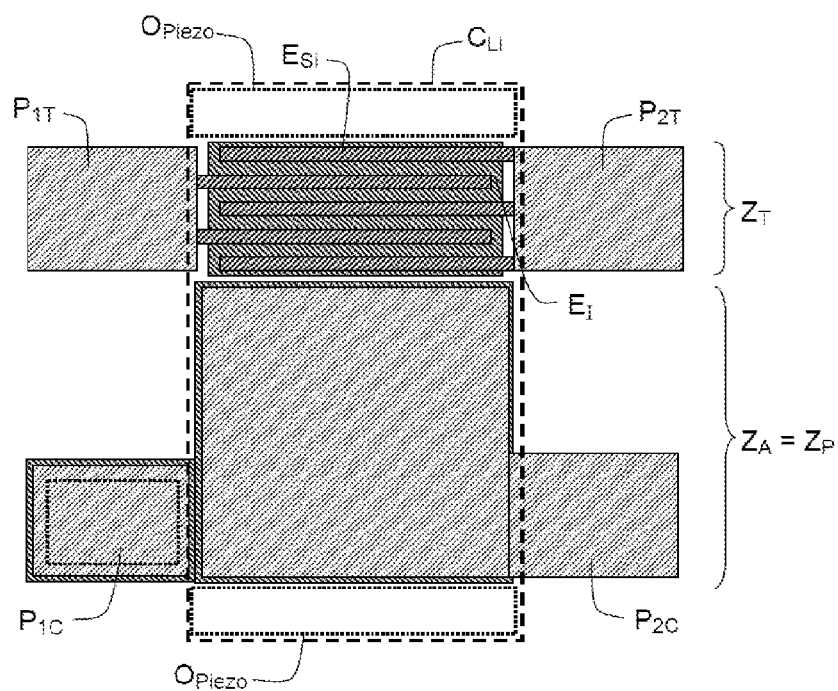

With a view to producing a dynamically frequency-tunable resonator, it is advantageous to modify the velocity of propagation of the waves within the cavity by modifying the conditions at the electrical limits in this cavity by the use of a tunable reactive electrical load, as described in the article: "Frequency Tuning of Film Bulk Acoustic Resonators" by the authors Amanda A. Frederick, Hsin-Hua Hu, William W. Clark, University of Pittsburgh, Bendum Hall, Pittsburgh, Pa., USA 15261, Proc. of SPIE Vol. 6172 617203, (2006). FIGS. 12*a* and 12*b* thus respectively illustrate a cross-sectional view and a top view of such a structure comprising a transduction region $Z_T$ and a free propagation region $Z_P$ for the waves, this region furthermore comprising an upper electrode $E_{As}$ and a lower electrode $E_{AI}$ allowing this cavity $Z_A$ to be rendered equivalent to a capacitance that can advantageously be connected to an outside external load C, so as to vary its properties, thus with $Z_P = Z_A$. More precisely, FIG. 12*b* shows the connection lugs for the capacitors $P_{1C}$ and $P_{2C}$, the lugs referred to as upper RF connection lugs for the transduction region $P_{1T}$ and $P_{2T}$, the openings $O_{piezo}$ in the piezoelectric material allowing an access for contact with the lower electrode and the bounding of the liberation well CLi for defining the membrane allowing the propagation of Lamb waves to be defined.

Figure 13:
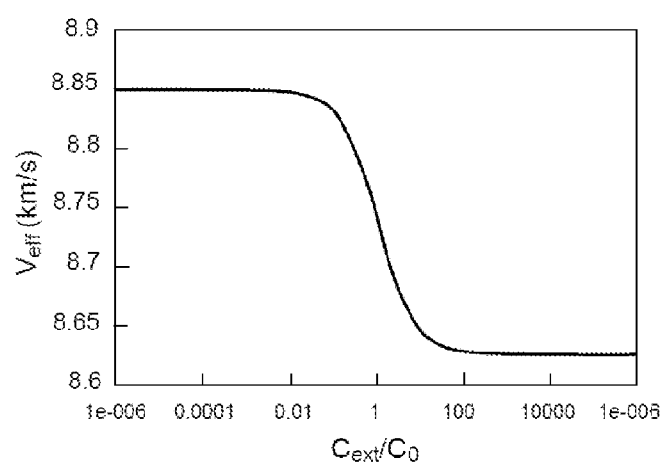
FIG. 13 illustrates the variation of velocity of the wave S0 within the cavity as a function of the ratio between external capacitance and capacitance of the cavity.
Figure 14:
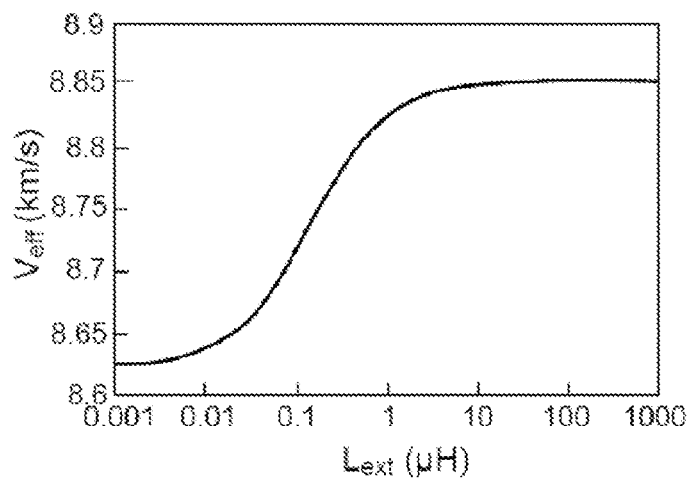
FIG. 14 illustrates the variation of velocity of the wave S0 in the cavity as a function of the value of a variable inductance.
Figure 15:
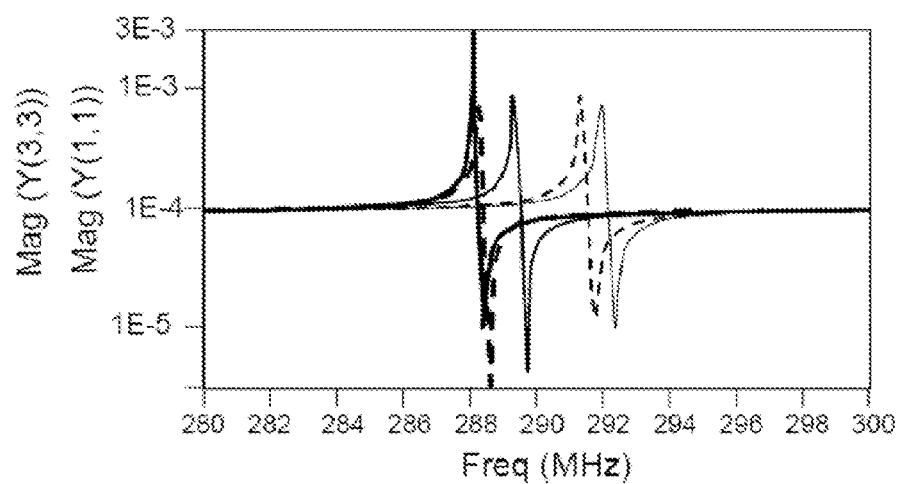
FIG. 15 illustrates the electrical response of the Lamb wave resonator as a function of applied external capacitances.

FIG. 13 shows the variations in velocity of the Lamb wave $S_0$ in the multilayer being considered, which is the wave used in the present example, within the cavity as a function of the ratio between an applied external capacitance and the capacitance of the cavity itself. In a similar fashion, FIG. 14 illustrates the effect of an external inductance $L_{ext}$ on the velocity of the wave $S_0$ within the cavity. It can be noticed that the aspect of the variation in velocity is inverted with respect to the use of a capacitor. Finally, FIG. 15 shows the variation in frequency determined from the variations in velocity produced by the adjustment of an external variable capacitor for a cavity with a length of 120 μm, the various curves relating to various values of the external capacitor able to vary from 10 pF to 100 nF. Y(2,2) is the admittance of the reference device onto which no external capacitor is connected and Y(3,3) is the admittance of the device onto which a variable capacitor is connected, where the two curves can thus be treated as a single curve.

The example presented hereinabove shows an electromechanical device with a single tuning cavity and assumes that means are available allowing variations in capacitances or in inductances of the order of several orders of magnitude (typically by a factor $10^4$ according to FIGS. 9 and 10) to be obtained.

It may be advantageous to divide up the tuning cavity corresponding to the impedance matching region into several sections which are independently controlled. This can, on the one hand, allow the values of the capacitance of the cavity being controlled to be decreased (and hence the values of maximum capacitances to be attained to be reduced and, conversely, the tolerance to a resistance in the control circuit to be increased), which becomes particularly useful in the case of the use of piezoelectric layers with high dielectric permittivity (Lithium Niobate or PZT for example) and used in thin layers. On the other hand, in order to make best use of the possible excursions in frequency, a switch could be used (integrated or using MEMS technology) to open or close a circuit to a fixed capacitor (or forming an open/closed circuit). Thus sections are available whose constants for propagation of the wave exploited can be made to vary in a binary fashion.

Figure 16:
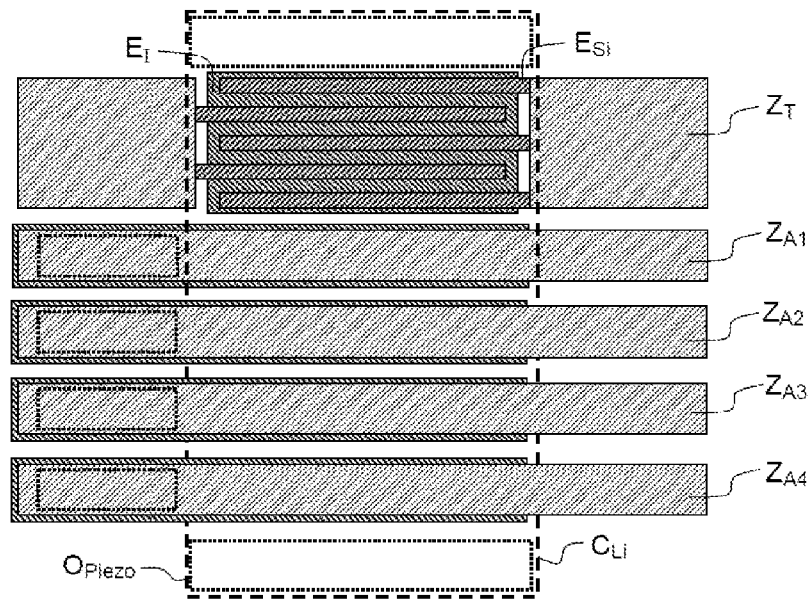
FIG. 16 illustrates a second example of electromechanical device according to the invention comprising a set of discontinuous impedance matching regions.
Figure 17:
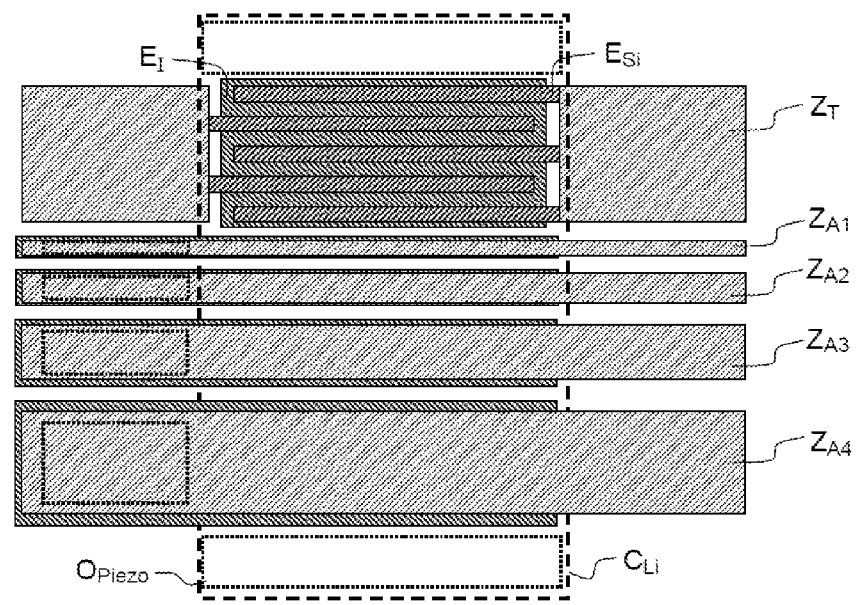
FIG. 17 illustrates a third example of electromechanical device according to the invention comprising a set of discontinuous impedance matching regions with dimensions exhibiting a geometrical progression.

By a regular arrangement of the cavities, like that in FIG. 16 which illustrates one example with four regions for impedance matching $Z_{A1}$, $Z_{A2}$, $Z_{A3}$ and $Z_{A4}$, the frequency of the resonator can be varied as a function of the number of sections whose switch is closed (or open).

One more advantageous method consists in dividing up the tuning cavity into sections whose lengths follow a geometrical progression (for example with a ratio 2), as shown in FIG.

17, which show impedance matching regions $Z_{A1}$, $Z_{A2}$, $Z_{A3}$ and $Z_{A4}$ with variable dimensions so as to be able to fix the frequency of the resonator by addressing the various cavities according to a digital representation (in base 2 for a geometrical progression with ratio 2, for example).

Figure 18:
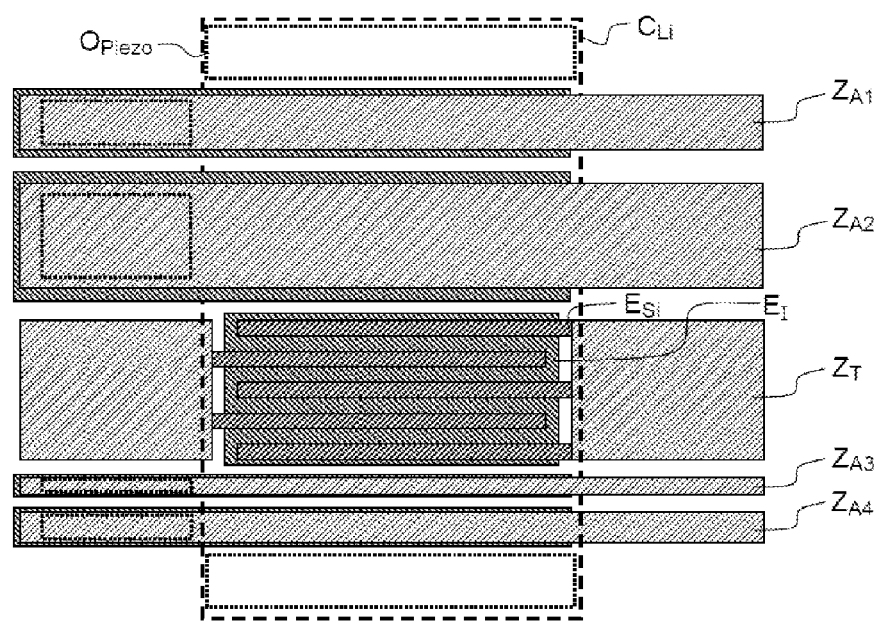
FIG. 18 illustrates a fourth example of electromechanical device according to the invention comprising a set of discontinuous impedance matching regions distributed on either side of the transduction region.

It should be noted that if the cavity is divided up into several sections, it is not necessary for all the impedance matching regions to be predisposed in a particular order, nor even that they be disposed in a contiguous manner. It is, in particular, possible to dispose the latter on either side of the transduction region, as shown in FIG. 18.

Figure 19A:
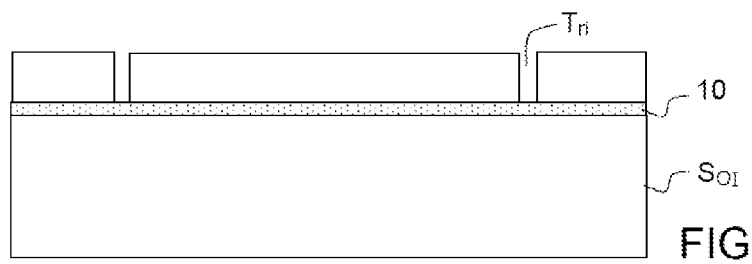
FIGS. 19a to 19l illustrate the various steps in a first example of method of fabrication of an electromechanical device according to the invention.

Example of Fabrication of an Electromechanical Device According to the Invention As illustrated in FIG. 19a, starting from a substrate of the SOI type, the trenches Tri are formed in the upper layer of silicon by an etching process, thus reaching the insulating layer 10 within the SOI.

Figure 19B:
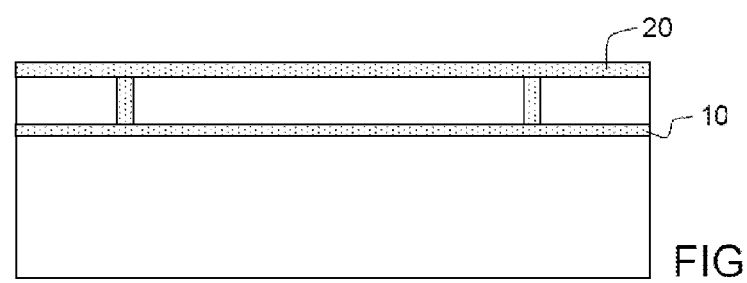

An operation for thermal oxidation of the said substrate and thus the formation of an etch stop well is carried out as illustrated in FIG. 19b, notably defining an upper dielectric layer 20.

Figure 19C:
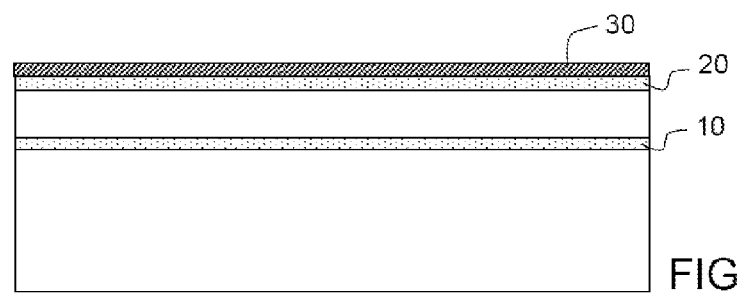

On the surface of the said layer 20, the deposition of a conducting layer 30 of molybdenum is carried out, as illustrated in FIG. 19c.

Figure 19D:
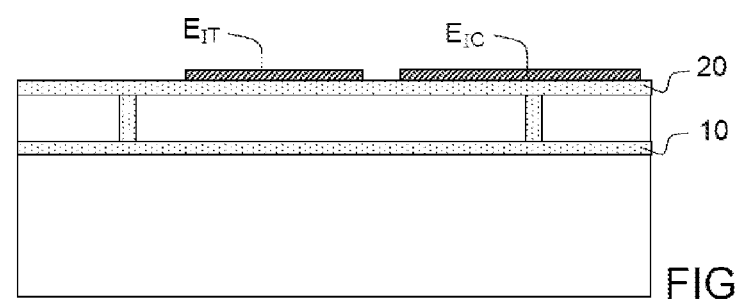

The lower electrodes $E_{IT}$ and $E_{IC}$ of the transduction region and of the impedance matching region are then formed in the layer of molybdenum, as illustrated in FIG. 19d, by lithography, fluorine-based dry etching and photoresist removal.

Figure 19E:
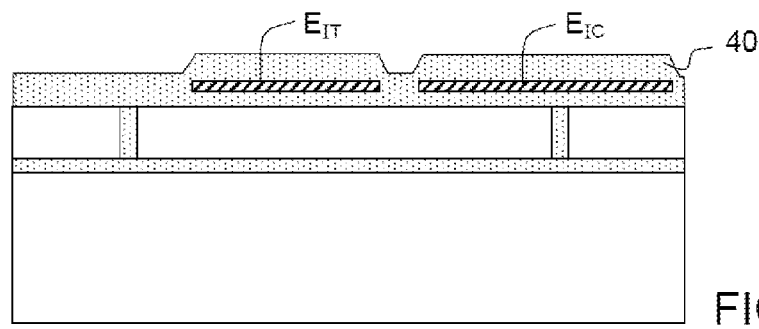
Figure 19F:
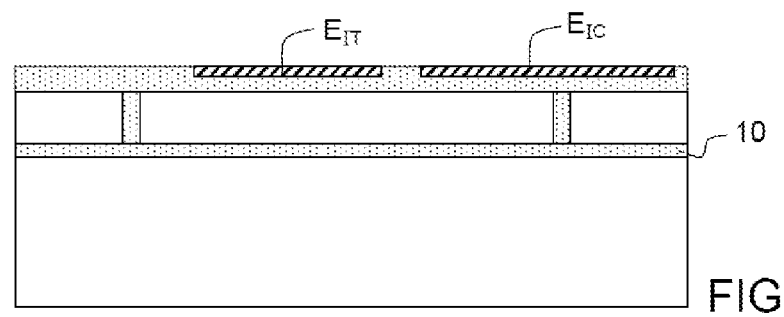

Deposition 40 of a planarization layer of $SiO_2$ is then carried out by PECVD (Plasma Enhanced Chemical Vapour Deposition) as shown in FIG. 19e, then a planarization operation is carried out stopping flush with the lower electrodes as illustrated in FIG. 19f.

Figure 19G:
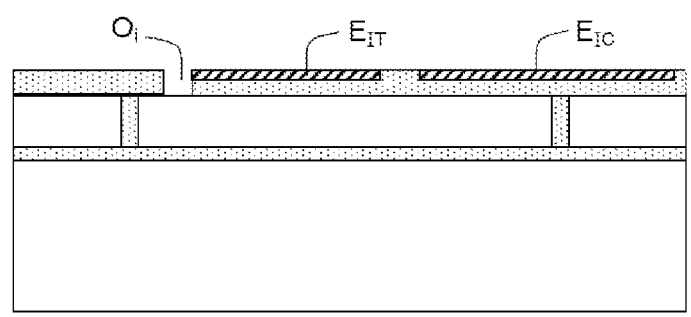

Then, the etching of steps into the lower level is carried out in order to define the openings Oi, with vertical sides, as illustrated in FIG. 19g.

Figure 19H:
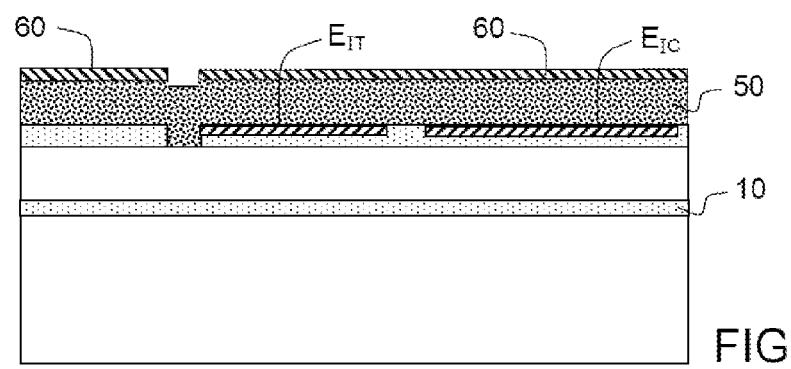

A layer 50 of piezoelectric material of AlN is then deposited by pulsed-DC reactive sputtering, on the surface of which an upper layer 60 of molybdenum is deposited by sputtering, as illustrated in FIG. 19h.

Figure 19I:
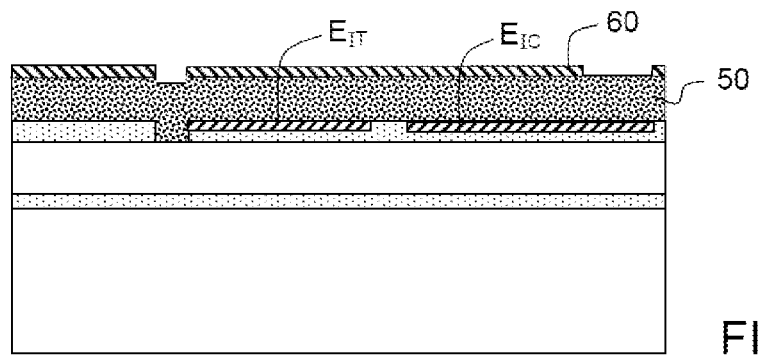

A molybdenum hard mask is then defined by lithography, fluorine-based dry etching and photoresist removal, as illustrated in FIG. 19i.

Figure 19J:
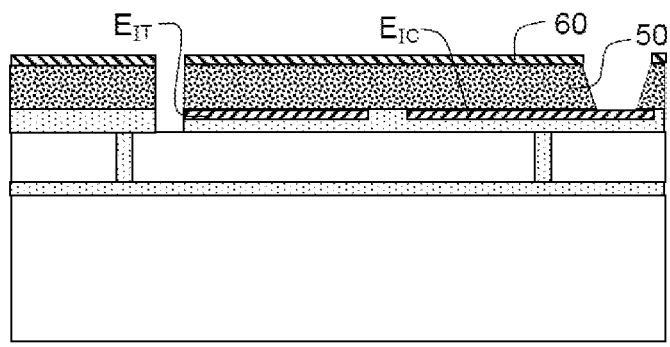

A wet etching operation is then carried out with a solution of $H_3PO_4$ at 80° C., so as to define the membrane sides and the access to the lower electrodes as illustrated in FIG. 19j.

Figure 19K:
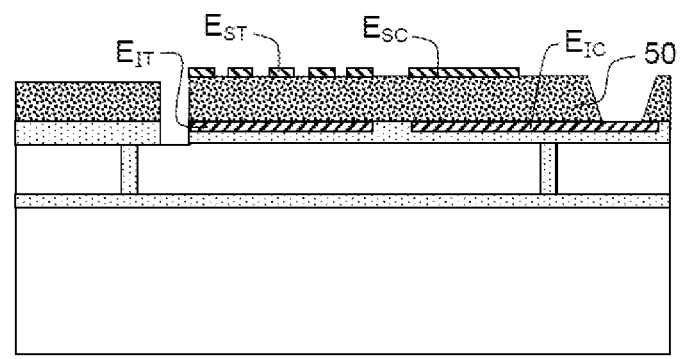

The upper electrodes $E_{ST}$ of the transduction region and the upper electrode dedicated to the load matching region $E_{SC}$ are then formed by lithography, fluorine-based dry etching and photoresist removal as illustrated in FIG. 19k.

Figure 19L:
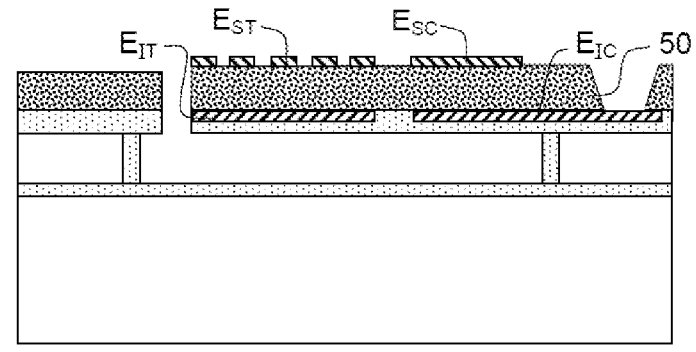

Finally, the etching of the silicon in the wells by $XeF_2$ gas is carried out in order to liberate the membrane as illustrated in FIG. 19l.

Second Example of Method of Fabrication of an Electromechanical Device

Rather than using Lamb waves in a membrane of aluminum nitride, it is also possible to use guided waves in a layer of aluminum nitride isolated by an acoustic Bragg mirror, taking as inspiration structures described in the article by I. Kone, F. Domingue, A. Reinhardt, H. Jacquinot, M. Borel, M. Gorisse, G. Parat, F. Casset, D. Pellissier-Tanon, J. F. Carpentier, L. Buchaillot, B. Dubus, *Guided acoustic wave resonators using an acoustic Bragg mirror*, Applied Physics Letters 96, 223504 (2010).

Figure 20A:
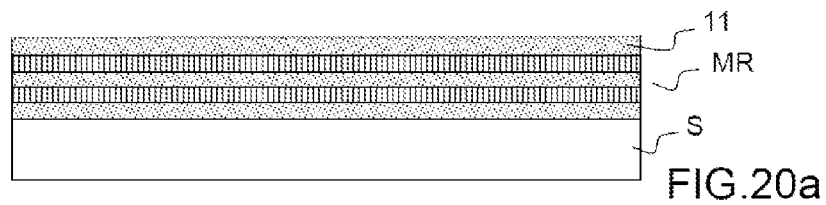
FIGS. 20a to 20f illustrate the various steps in a second example of method of fabrication of an electromechanical device according to the invention.

In a first step illustrated in FIG. 20a, the deposition of an alternation of layers of SiOC and of SiN is carried out forming the Bragg mirror MR on the surface of a substrate S, then a layer 11 of $SiO_2$ is deposited onto the surface of this multilayer. All these layers are deposited by PECVD.

Figure 20B:
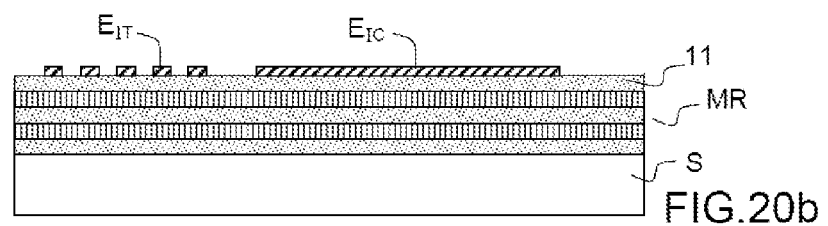

In a second stage, the deposition by sputtering of a layer of molybdenum is carried out, then the lower electrodes are formed by lithography, fluorine-based dry etching and photoresist removal, as illustrated in FIG. 20b which indicates the lower electrodes $E_{IT}$ and $E_{IC}$ of the transduction region and of the impedance matching region.

Figure 20C:
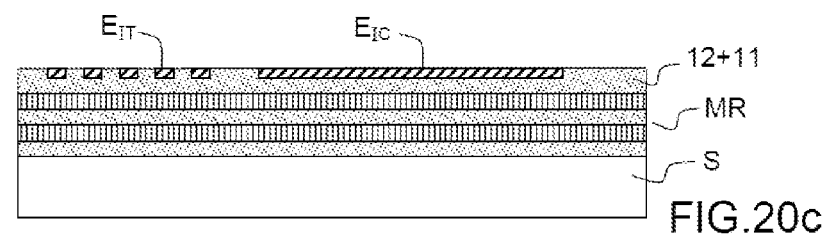

An additional layer 12 of $SiO_2$ is then deposited by PECVD and is then planarized until the assembly of the layers 11+12 is flush with the electrodes, as illustrated in FIG. 20c.

Figure 20D:
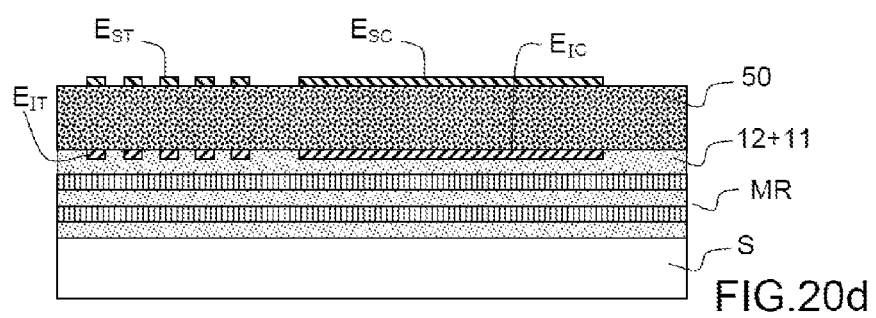

Subsequently, a layer 50 of AlN and a layer of molybdenum are deposited, then operations for lithography, fluorine-based dry etching and photoresist removal are carried out so as to define the upper electrodes $E_{ST}$ and $E_{SC}$, as illustrated in FIG. 20d.

Figure 20E:
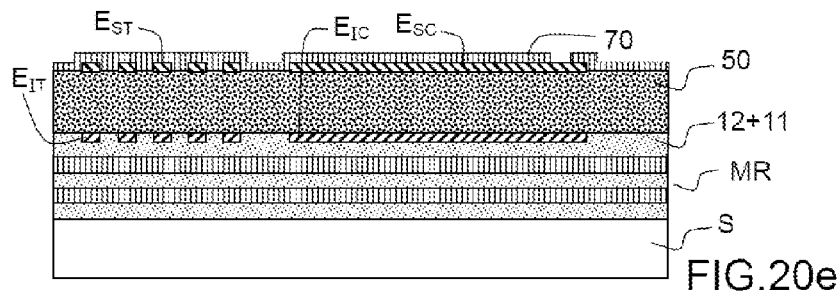

A passivation layer 70 of SiN is then deposited by PECVD. Then, by lithography, dry etching and photoresist removal, electrical contacts are opened up as illustrated in FIG. 20e.

Figure 20F:
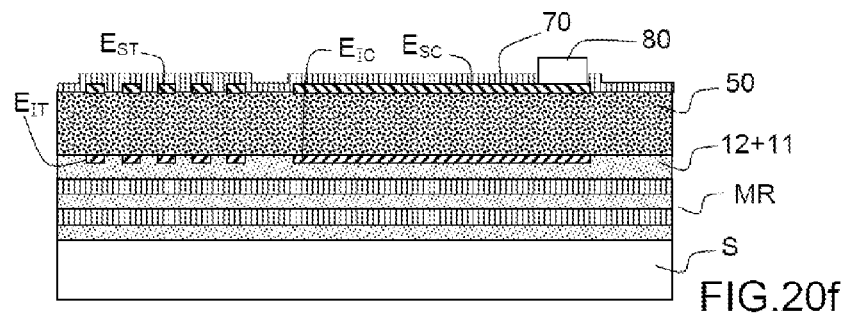

Finally, a layer of aluminum is deposited by sputtering, and lithography, chlorine-based dry etching and photoresist removal are carried out in order to form the contact lugs 80, as illustrated in FIG. 20f.

It should be noted that, as in the case of the first embodiment, the electromechanical device of the present invention can comprise various alternatives with regard to the lower electrodes.

Figure 21A:
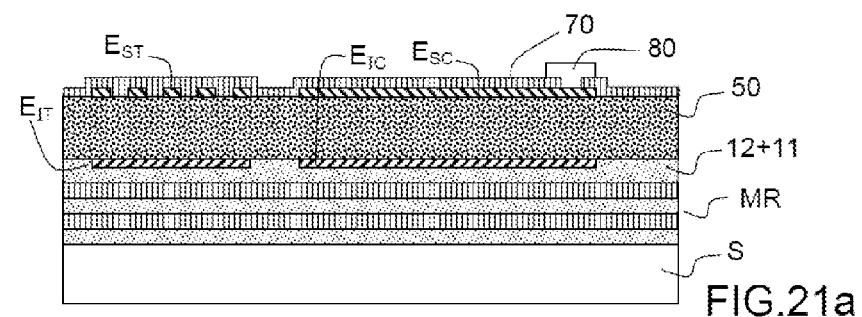
FIGS. 21a to 21c illustrate variants of the exemplary structure obtained by the various steps in the third example of fabrication of an electromechanical device whose steps are illustrated in FIGS. 20a to 20f.

According to one variant of this method, a continuous electrode can be used under the transducer, which simplifies the lithography processes since the alignment precision necessary between the patterns for the lower and upper electrodes accordingly as a result is reduced. The method of fabrication of this variant is then identical, the only change being the patterns implemented. The structure thus obtained is shown in FIG. 21a.

Figure 21B:
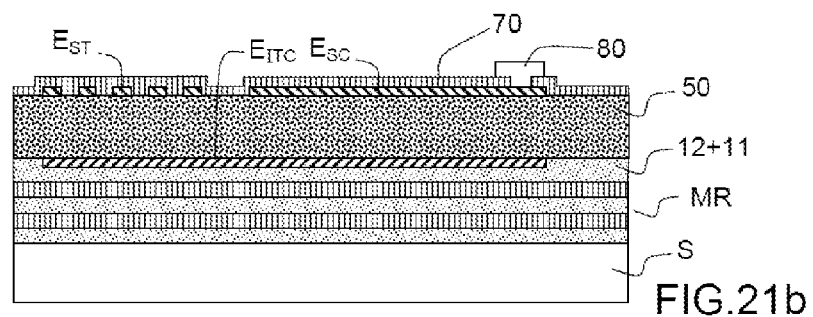

Another variant, illustrated in FIG. 21b, consists in using a common lower electrode $E_{ITC}$ between the cavity and the transducer. This is particularly adapted to a structure where the resonator has a differential connection (the interdigitated combs are connected to lines propagating signals in phase opposition with respect to one another). In this case, the lower electrode is connected to the ground of the cavity tuning circuit, and also serves as ground for the transducer.

Figure 21C:
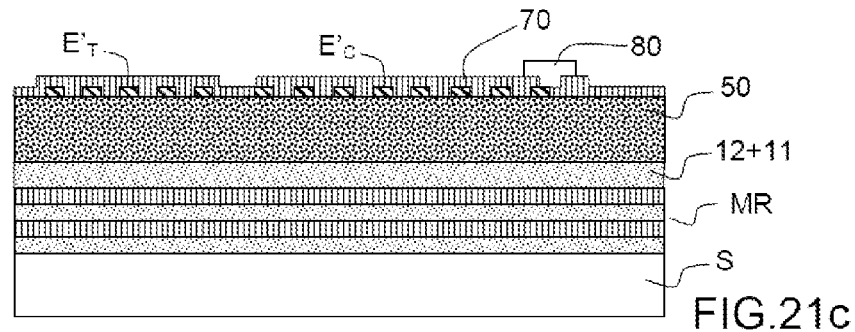

Lastly, it is also possible to use acoustic modes only sensitive to a horizontal electric field (notably the case of a structure in which the aluminum nitride has its crystallographic c-axis positioned in the horizontal plane). In this case, a lower electrode is no longer needed in the transducer. With regard to the cavity, an electric field generated by interdigitated combs formed on the surface of the piezoelectric layer allows the desired effect of modification of the velocity of propagation of the waves to be obtained. Such a structure is illustrated in FIG. 21c. However, so as not to interfere with the propagation of the wave, and notably be subjected to the filtering effect due to the fact that interdigitated combs $E'_T$ and $E'_C$ can only emit acoustic waves efficiently within a reduced band of frequencies, it is preferable in this latter case for the metallizations of the cavity to have a periodicity equal to that (or a multiple of that) of the combs in the transducer.

Lastly, materials other than aluminum nitride can be employed. The following method of fabrication, for example, shows how membranes of Lithium Niobate can be used.

Third Example of Method of Fabrication of an Electromechanical Device

Figure 22A:
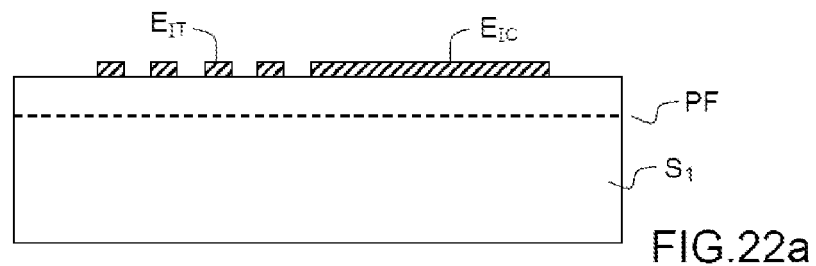
FIGS. 22a to 22h illustrate the various steps in a third method of fabrication of an electromechanical device according to the invention.

According to a first step, a substrate S1 of Lithium Niobate is cleaned, then an operation for ion implantation (by Hydrogen or Helium) is carried out so as to form a fragilized region PF with a given thickness. Aluminum is deposited, then, by photolithography, dry etching, photoresist removal, the lower electrodes $E_{IT}$ and $E_{IC}$ are formed as illustrated in FIG. 22a.

Figure 22B:
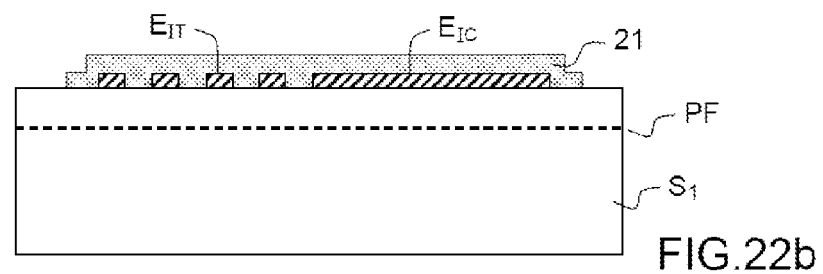

A deposition of silicon 21 is then carried out at low temperature, and by photolithography, dry etching and photoresist removal, a layer referred to as a sacrificial layer is formed, as illustrated in FIG. 22b.

Figure 22C:
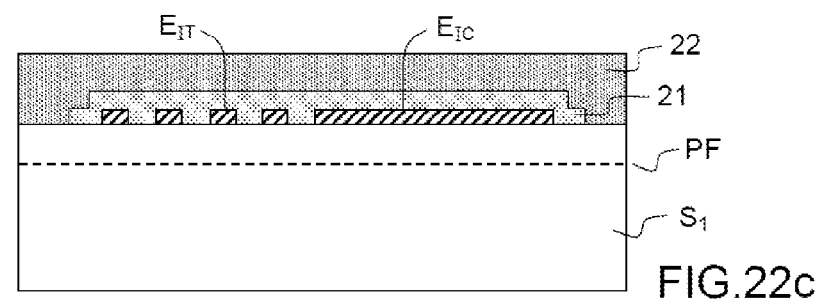

A layer of silicon oxide 22 is then deposited at low temperature in order to form a counter-mask by lithography and by dry etching, after photoresist removal and a planarization operation as illustrated in FIG. 22c.

Figure 22D:
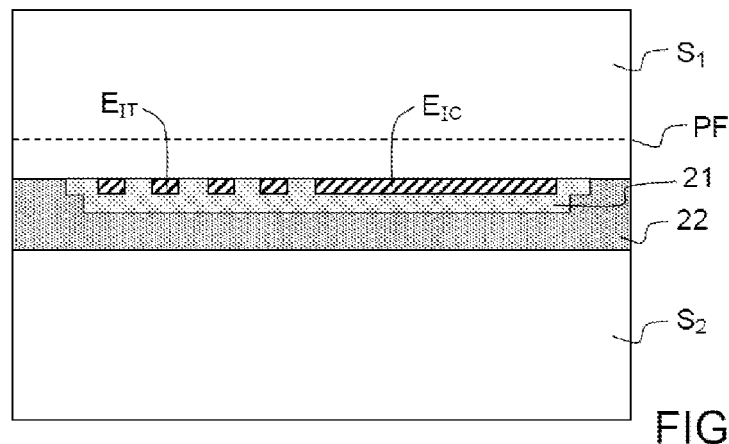

An operation is carried out for molecular bonding of the wafer onto a substrate referred to as "host substrate" S2 of Lithium Niobate as illustrated in FIG. 22d.

Figure 22E:
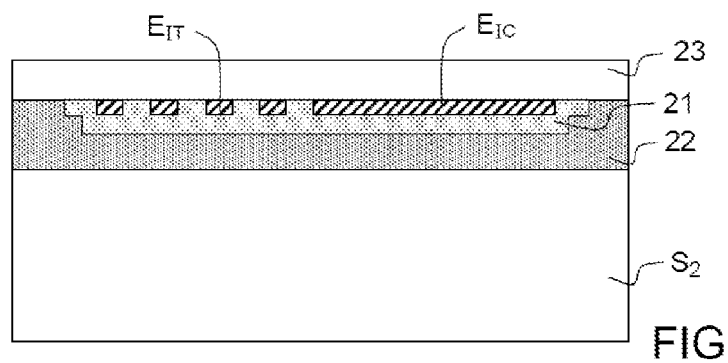

Subsequently, the fracture out of the assembly pre-formed on the substrate of Lithium Niobate implanted as illustrated in FIG. 22e is carried by heating in the fragilized region PF.

Figure 22F:
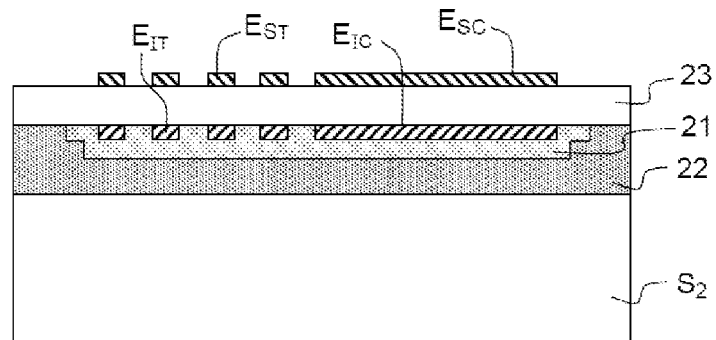

A layer of aluminum is thus deposited, then by lithography, dry etching and photoresist removal, the upper electrodes $E_{ST}$ and $E_{SC}$ are defined as illustrated in FIG. 22f.

Figure 22G:
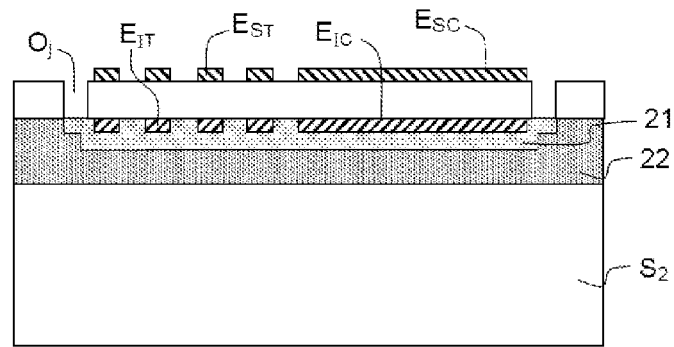

Openings Oj are subsequently defined in the layer of Lithium Niobate by lithography, dry etching and photoresist removal as illustrated in FIG. 22g.

Figure 22H:
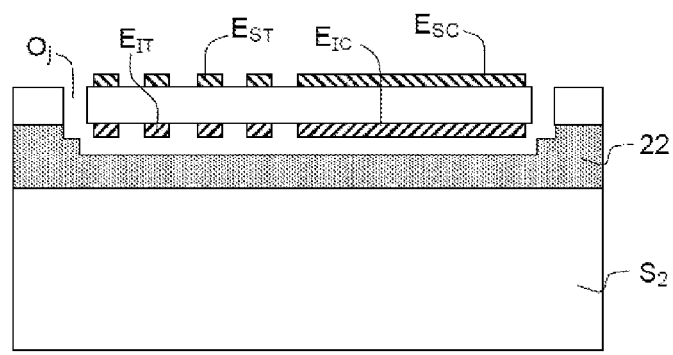

Finally, gaseous xenon diflouride etching of the sacrificial layer of amorphous silicon is carried out in order to liberate the membrane as illustrated in FIG. 22h.

It is also possible to further differentiate this variant with a continuous electrode under the transducer, or with a common electrode between transducer and cavity, or a further possibility without lower electrode, in which case the metallizations on the surface of the cavity also have patterns in the form of interdigitated combs.

Fourth Example of Method of Fabrication of an Electromechanical Device

Figure 23A:
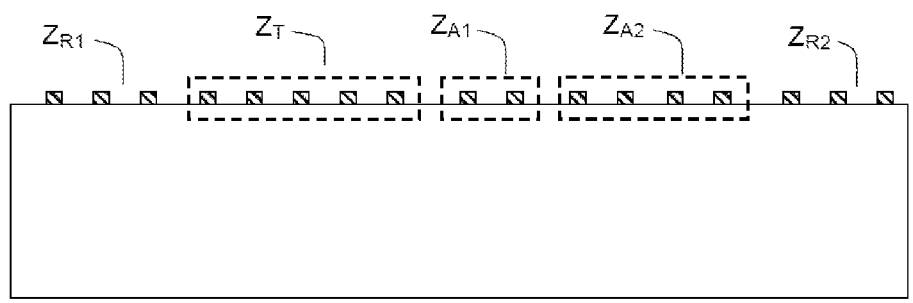
FIGS. 23a and 23b relate to a fourth example of device according to the invention, FIG. 23c relating to an electrical circuit diagram of the said device obtained.
Figure 23B:
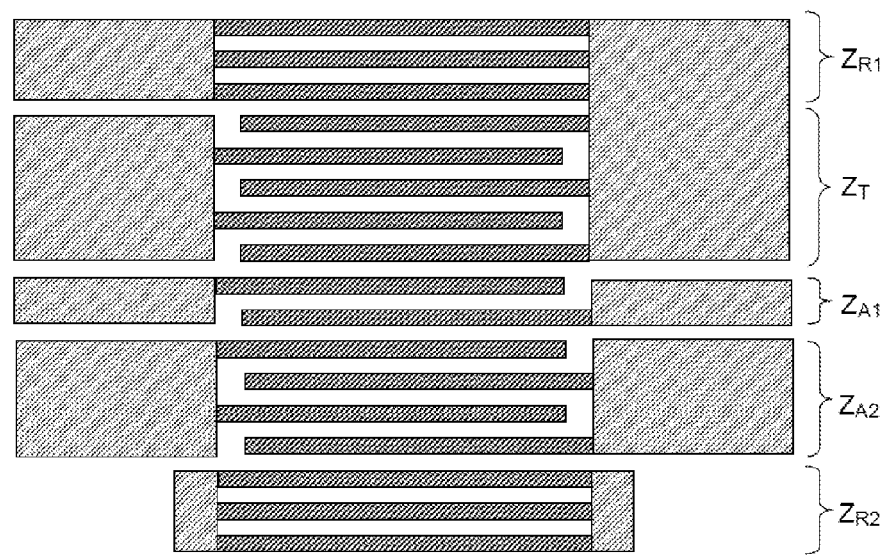
Figure 23C:
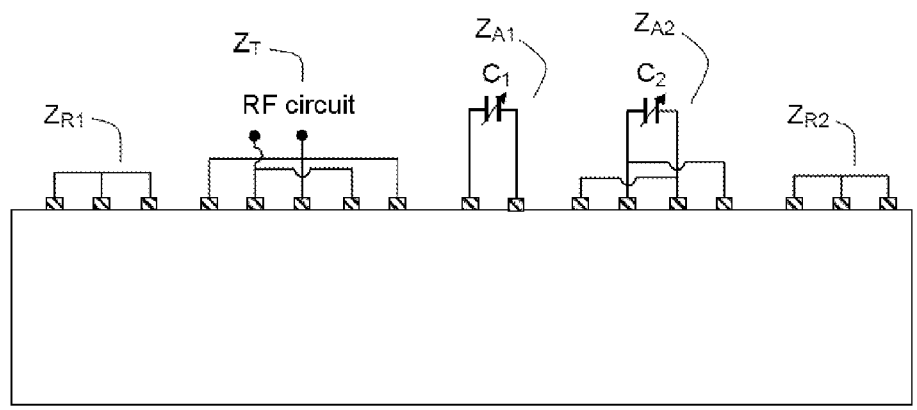

According to a first step, a substrate of Lithium Niobate is cleaned. Aluminum is deposited, then, by photolithography, dry etching and photoresist removal, the electrodes are formed as illustrated in FIG. 23a. These electrodes, shown in FIG. 23b, take the form of interdigitated combs in the transducer and in the frequency tunability regions, and of reflectors with short-circuited interdigitated combs in the reflecting regions $Z_{R1}$ and $Z_{R2}$ which bound the resonant cavity. It can be noticed on this diagram that the tunability region $Z_{A2}$ has twice the length of the region $Z_{A1}$. FIG. 23c shows an electrical circuit diagram of the system composed of the tunable resonator and of its control electronics.

Figure 24A:
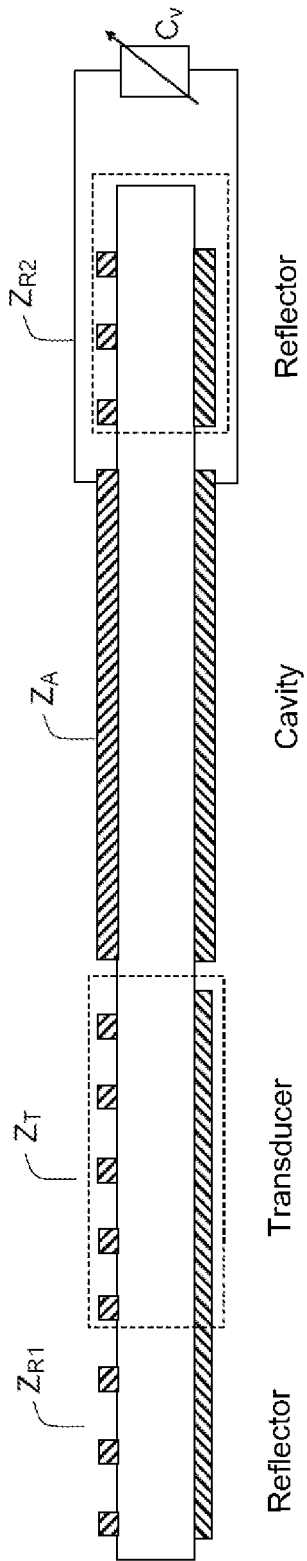
FIGS. 24a and 24b illustrate a cross-sectional view and a top view of one example of electromechanical device of the invention comprising reflection regions.
Figure 24B:
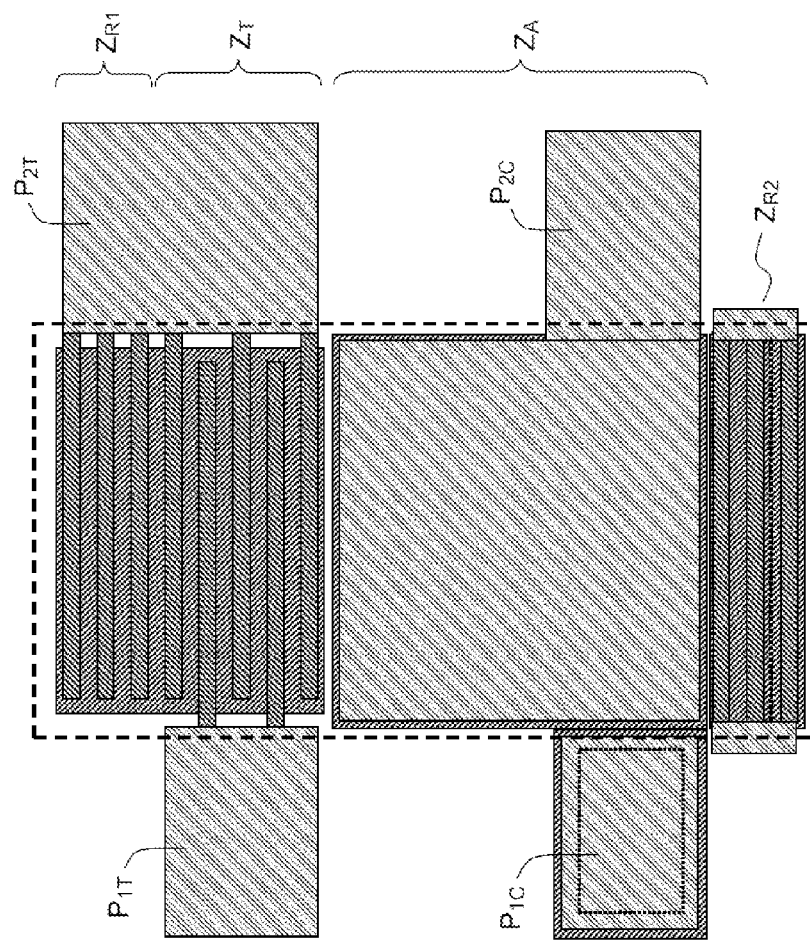

Example of Electromechanical Device According to the Invention Comprising Reflection Regions The examples of electromechanical devices previously described used the piezoelectric plane structure edges. It can also be advantageous for the device of the invention to comprise reflection regions allowing the resonant cavity to be bounded beyond the exploitation of the edges of the piezoelectric plane structure of the resonant cavity (such as that illustrated in FIG. 6). FIGS. 24a and 24b thus illustrate one example of device comprising reflection regions $Z_{R1}$ and $Z_{R2}$ surrounding the transduction regions $Z_T$ and the impedance matching region $Z_A$ connected to a variable load Cv.

The invention claimed is:

1. An electromechanical device comprising at least one resonator using acoustic waves propagating laterally within a piezoelectric plane resonant structure and at least comprising electrodes on one of the faces of said structure, the resonant structure comprising:
    a transduction region having a transduction length and generating acoustic waves;
    at least one free propagation region for the acoustic waves, adjacent to the said transduction region and defined in the same plane as the said transduction region;
    the total length of the resonant structure being equal to an integer number of half-wavelengths ($n\lambda/2$), the said wavelength complying with the following equation $f=V/\lambda$, with f corresponding to the resonance frequency of the said resonator and V the average velocity of propagation of the wave within the structure, so as to adjust the quality factor of the resonator fixed by the total length of the resonant structure and the coupling coefficient fixed by the ratio of the transduction length over the total length of the resonant structure;
    the resonant structure defined by the assembly of the transduction region and of the propagation region being laterally bounded by reflection regions: and
    wherein the piezoelectric plane structure further comprises at least one region being a tunability region formed by all or part of the propagation region and tunability electrodes formed on at least one of the faces of the tunability region so as to define at least one capacitor capable of being connected to at least one external variable impedance.

2. The electromechanical device according to claim 1, wherein the transduction region has a working frequency band being a transduction frequency band, the reflection regions have a working frequency band being a reflection frequency band, and the resonance frequency of the resonator is included within the transduction and reflection working frequency bands.

3. The electromechanical device according to claim 1, wherein the resonant structure comprises edges corresponding to a physical bounding corresponding to an interface between the propagation medium corresponding to a first medium and a second medium.

4. The electromechanical device according to claim 1, wherein each external variable impedance is obtained by a bank of fixed capacitors.

5. The electromechanical device according to claim 1, wherein all or part of the electrodes of the structure form an interdigitated structure, or interdigitated structures, of surface electrodes on a first face of the said structure.

6. The electromechanical device according to claim 1, wherein the tunability region only comprises electrodes on one of the faces of the structure in the said region.

7. The electromechanical device according to claim 1, wherein the structure further comprises at least one electrode on the second face of the said structure.

8. The electromechanical device according to claim 1, further comprising a set of K tunability regions, the transduction region being included between, on the one hand, M tunability regions and, on the other, N tunability regions, with K=M+N.

9. The electromechanical device according to claim 1, wherein the tunability regions have variable lengths.

10. The electromechanical device according to claim 9, wherein said lengths follow a geometrical progression of the $L_n = L_0 a^n$ type, where $L_0$ is the length of the shortest tunability region, a is a factor of the progression and n is the index of the region.

11. The electromechanical device according to claim 1, wherein the transduction region and at least one tunability region comprise a common electrode.

12. The electromechanical device according to claim 1, wherein the piezoelectric plane structure further comprises reflection regions comprising arrays of electrodes on the periphery of the free propagation and transduction regions.

13. The electromechanical device according to claim 1, wherein the piezoelectric structure is made of AlN.

14. The electromechanical device according to claim 1, wherein the piezoelectric structure is made of $LiNbO_3$.

\* \* \* \* \*